(12) United States Patent
DeMille

(10) Patent No.: US 11,067,601 B2
(45) Date of Patent: Jul. 20, 2021

(54) HIGH ACCURACY ELECTRICAL TEST INTERCONNECTION DEVICE AND METHOD FOR ELECTRICAL CIRCUIT BOARD TESTING

(71) Applicant: Donald DeMille, Mission Viejo, CA (US)

(72) Inventor: Donald DeMille, Mission Viejo, CA (US)

( * ) Notice: Subject to any disclaimer, the term of this patent is extended or adjusted under 35 U.S.C. 154(b) by 0 days.

(21) Appl. No.: 14/201,304

(22) Filed: Mar. 7, 2014

(65) Prior Publication Data

US 2014/0253159 A1      Sep. 11, 2014

Related U.S. Application Data

(60) Provisional application No. 61/775,072, filed on Mar. 8, 2013.

(51) Int. Cl.
*G01R 1/073* (2006.01)
*G01R 31/28* (2006.01)

(52) U.S. Cl.
CPC ...... *G01R 1/07328* (2013.01); *G01R 31/2808* (2013.01)

(58) Field of Classification Search
CPC .................. G01R 1/07328; G01R 31/2808
See application file for complete search history.

(56) References Cited

U.S. PATENT DOCUMENTS

| | | | |
|---|---|---|---|
| 4,707,655 A * | 11/1987 | Kruger | H01R 13/2421 324/755.01 |
| 5,174,763 A * | 12/1992 | Wilson | G01R 1/07328 439/245 |
| 5,818,248 A | 10/1998 | St. Onge | |
| 6,642,728 B1 * | 11/2003 | Kudo | H01L 21/67242 324/755.02 |
| 6,685,492 B2 * | 2/2004 | Winter | G01R 1/0466 324/754.08 |
| 6,992,496 B2 * | 1/2006 | Winter | G01R 1/0441 324/750.25 |
| 8,648,616 B2 | 2/2014 | St. Onge et al. | |

* cited by examiner

*Primary Examiner* — Paresh Patel
(74) *Attorney, Agent, or Firm* — Russel O. Primeaux; Jessica C. Engler; Kean Miller LLP

(57) ABSTRACT

A high accuracy electrical test interconnect method employs a tester interface transfer block to enable the transfer of electrical contact from less accurate tester resource probes to target probes which are contained in the tester interface transfer block and can be positioned with high accuracy using the three dimensional printing to enable reliable contact with smaller test pads. The target probes can directly contact the tester resource probes or a transfer plate can be interposed between the target probes and the tester resource probes to allow positional adjustment of the target probes relative to the tester resource probes. This invention also includes the use of specialized shape target probes that can contact circuit board objects, such as vertical conductive surfaces and irregular shape test pads that have not been accessible with traditional methods.

6 Claims, 6 Drawing Sheets

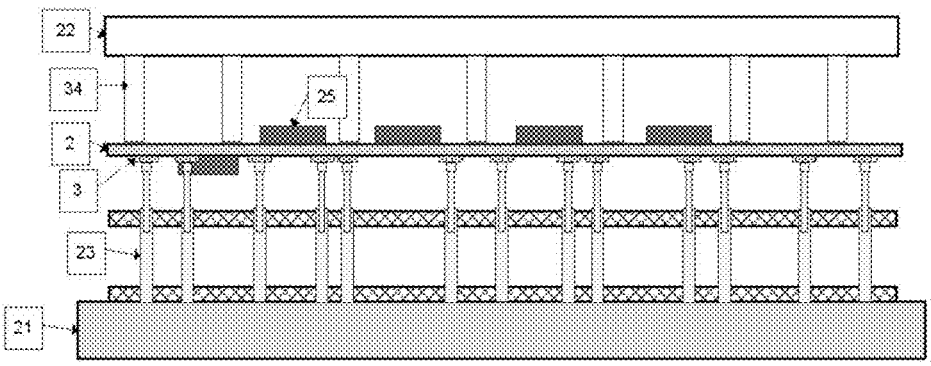
Figure 1 – Traditional Tester Configuration with a Custom Tester Interface and Top Pressure Rods Plate
Prior Art
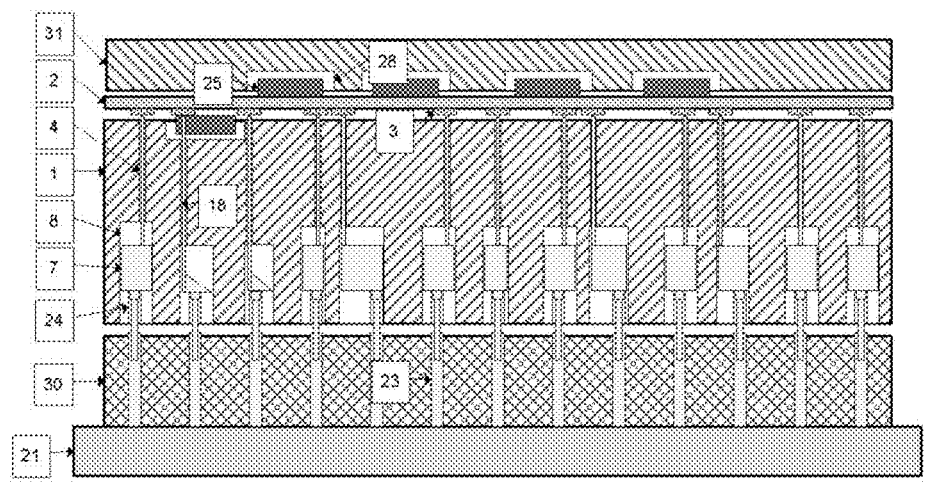
Figure 2 – Tester with a Fixed Grid Tester Interface, a Tester Interface Transfer Block and a Zero Flex Top Plate

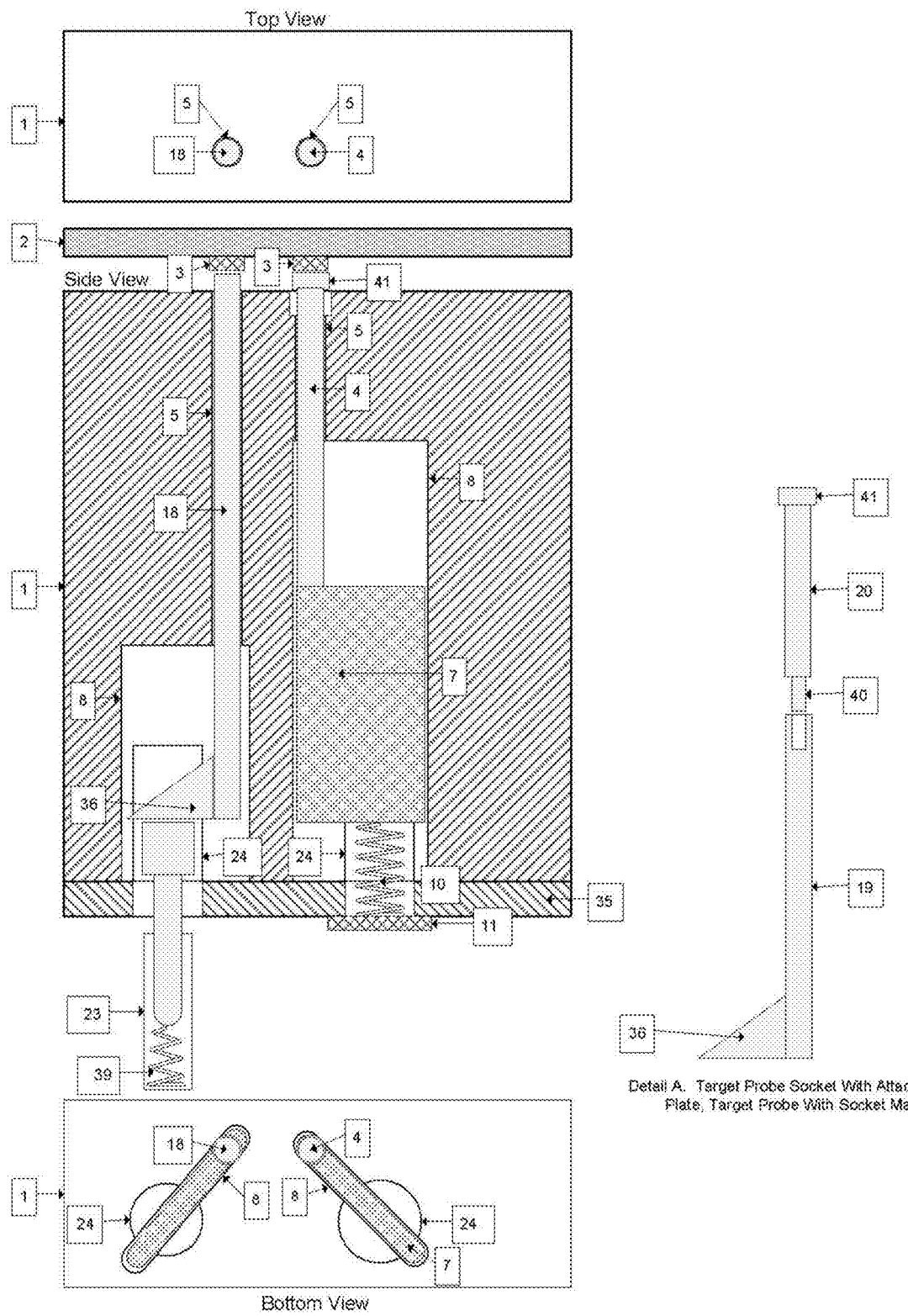
Figure 3 – Moving Transfer Plate Detail

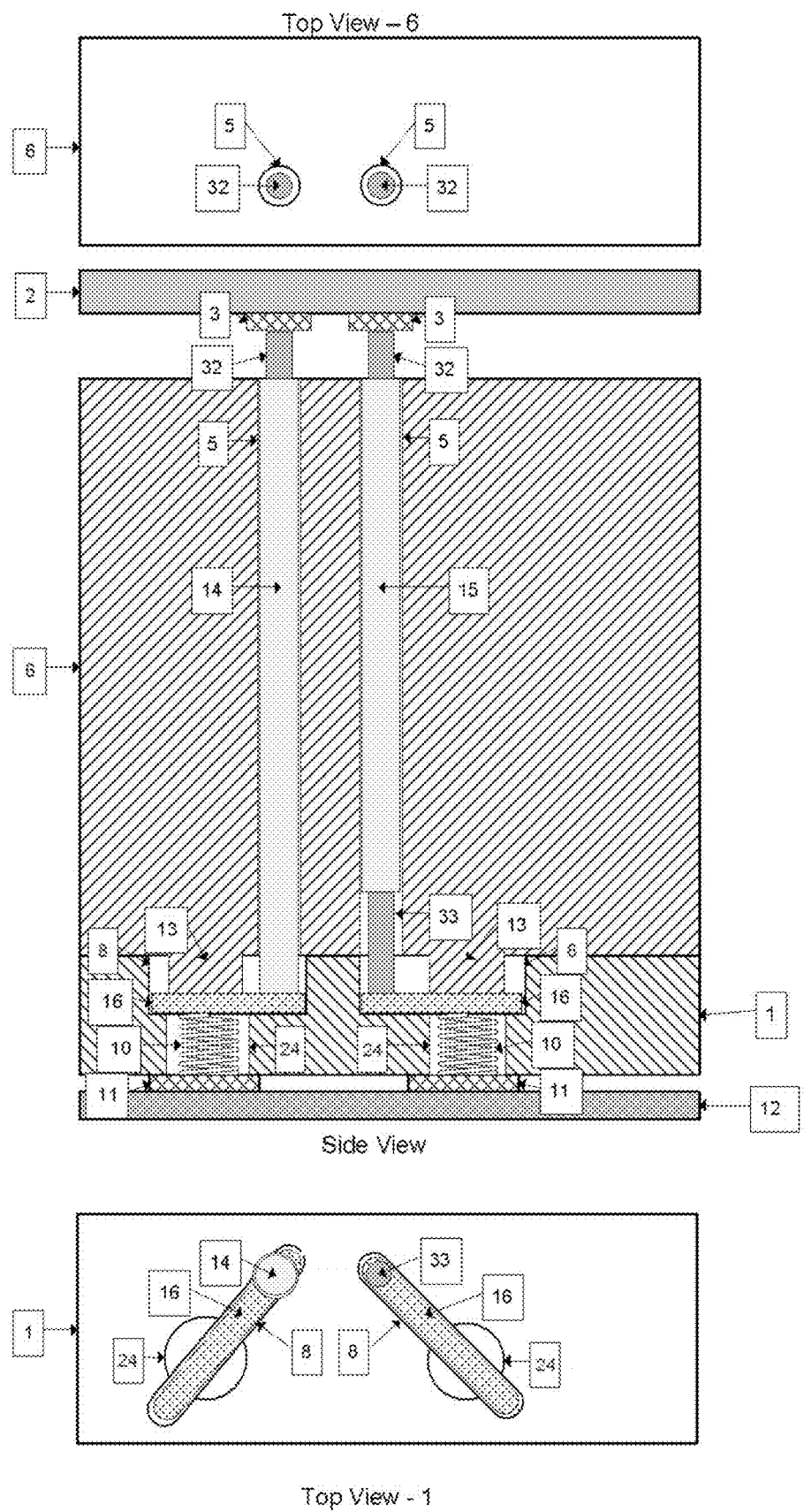
Figure 4 – Fixed Transfer Plates Detail

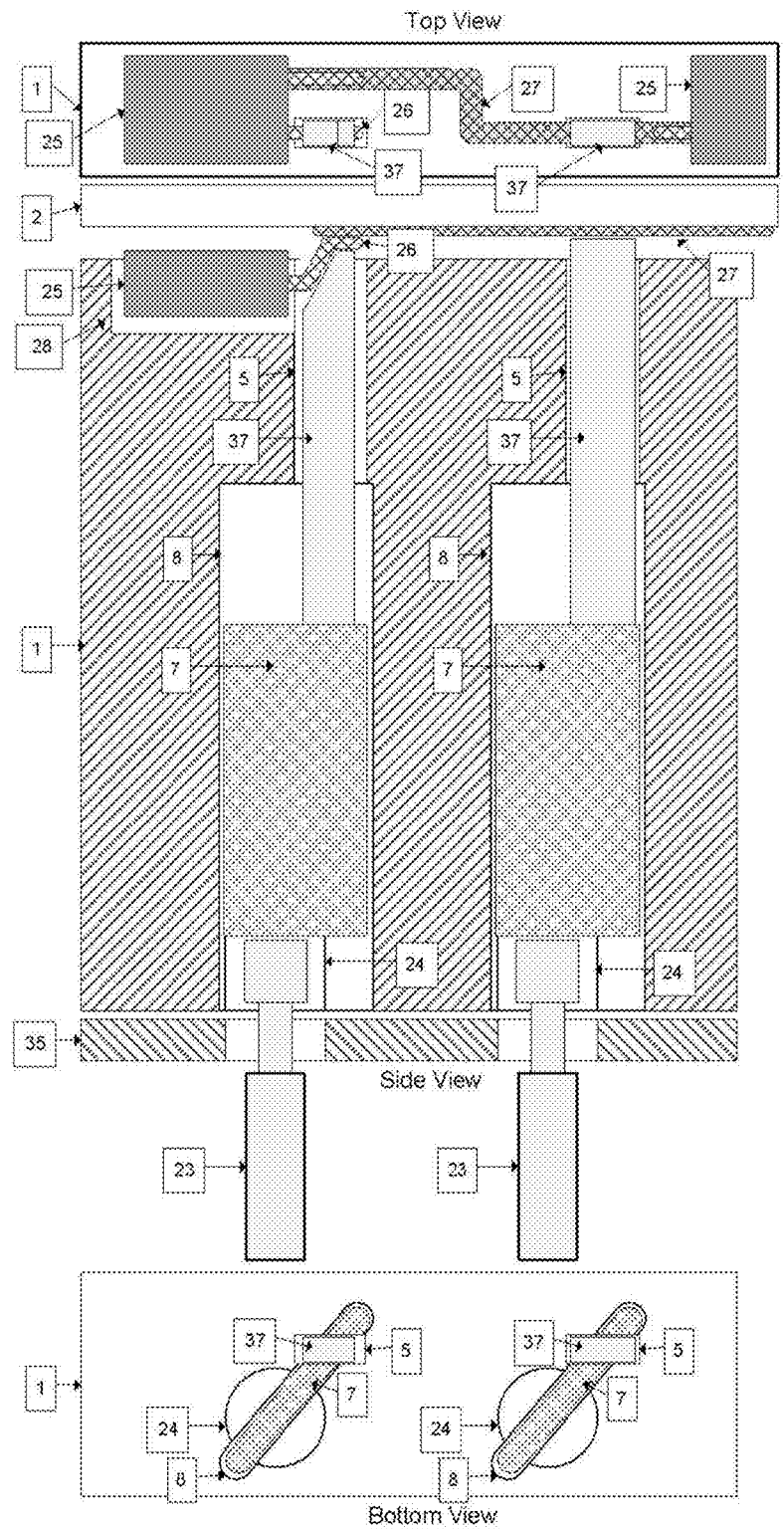
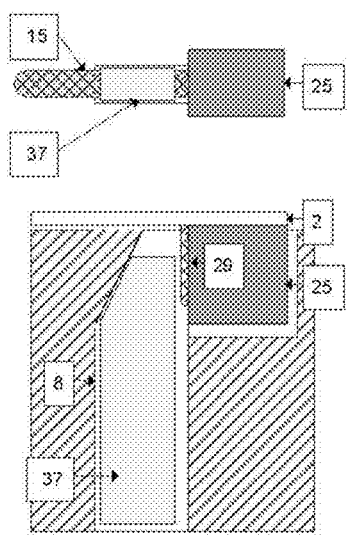
Figure 5 – Specialized Shape Probes
Side Exit Pin and Trace Contact
Figure 6 – Specialized Shape Probe
Vertical Side Exit Pin Contact

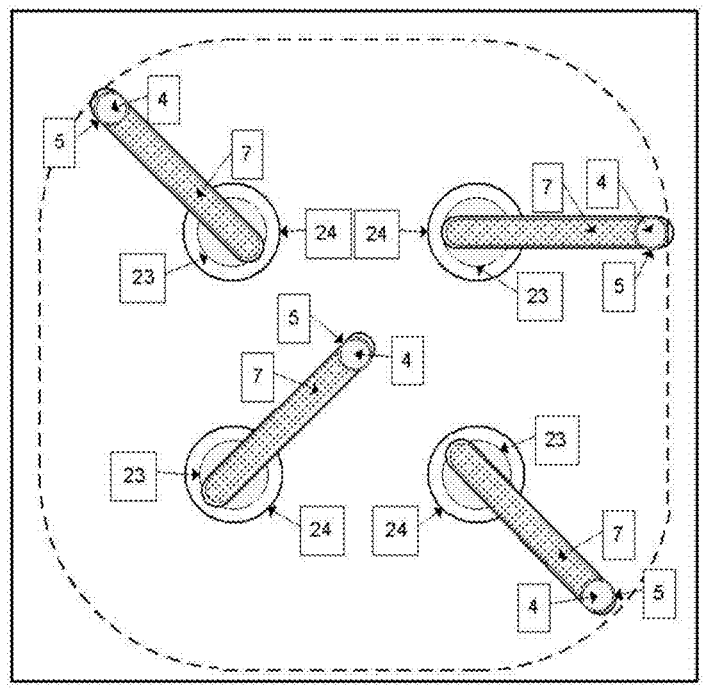
Figure 7 – Target Probe Location Limit
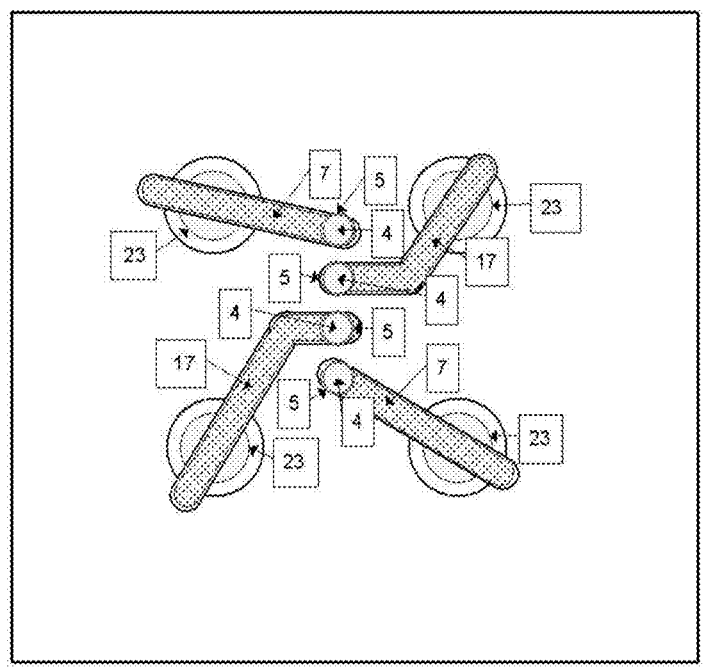
Figure 8 – Tight Target Pad Spacing Example
Using Angled Transfer Plates

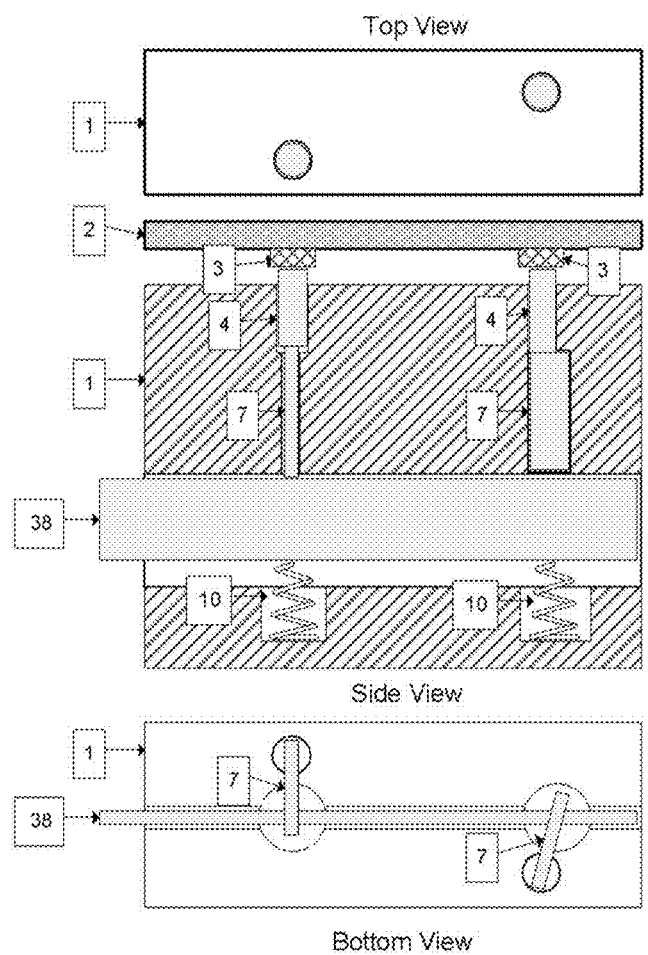
Figure 9 - Side Entrance
Transfer Plate Detail

HIGH ACCURACY ELECTRICAL TEST INTERCONNECTION DEVICE AND METHOD FOR ELECTRICAL CIRCUIT BOARD TESTING

This application claims the benefit of U.S. Provisional Patent Application No. 61/775,072 filed on Mar. 8, 2013. The disclosure of the referenced application is hereby incorporated herein in its entirety by reference.

The present invention relates to the field of fabricating electronic interconnections from a tester to a circuit board for the purpose of testing the electrical characteristics of the circuit board.

In-Circuit (ICT) or bare board testing of printed circuit boards is used to perform tests on printed circuit assemblies during the assembly phase. The general purpose of this testing is to find component and manufacturing problems with the boards before the full assembly is complete. ICT uses multiple probes to make electrical connections between a tester and various points on the circuit board being tested for the purpose of measuring the electrical characteristics of the board. This verification method tests the individual components of the circuit board and the components' connection to a substrate, which is typically the printed circuit board.

An example of a traditional ICT fixture setup is shown in FIG. 1. For these types of tests, a custom mechanical interface, called a fixture, is used to provide a method for connecting the spring loaded probes to the tester, and then to position the probes accurately such that they make reliable physical contact with the corresponding electrical test pads on the circuit board. A spring loaded probe is a probe with a tip, a body and an internal spring that compresses as the tip is pressed against a target test point. To complete the connection, the circuit board being tested is normally mounted on the fixture using a suitable guide method, and pressed against the probes, compressing the internal probe spring and thereby establishing a reliable electrical connection.

FIG. 1 is an illustration of the traditional tester configuration that uses an electric tester 21 and a pressure rods mounting plate 22. Circuit board 2 depicts the general placement of the printed circuit board during the testing process. In this configuration, the electric tester 21 is on the bottom with attached custom fixture interface. The attached custom fixture interface is usually comprised of multiple, vertically stacked plates machined and aligned to house the tester resource probes 23. The tester resource probes 23 directly contact the circuit board 2 as the circuit board 2 is pushed down onto the tester resource probes 23 by the pressure rods 34 during testing. This configuration is not reusable and is custom-made for each unique circuit board under test.

The electronic components that are mounted on a circuit board are continually decreasing in size, so the fixtures used to make the electrical test connections are required to make physical contact with ever smaller and more closely spaced test pads. Traditional ICT probes are long relative to the tip diameter. Any misalignment in the vertical dimension can cause the probe tip to deviate from intended target pad. To maintain vertical alignment as test pad sizes decrease has become increasingly more difficult and expensive using traditional manufacturing methods.

ICT fixtures have traditionally been constructed by drilling and routing plastic and metal plates to house the spring-loaded tester probes. These probes are mechanically complex and expensive, containing a socket, a probe tip and an internal spring to apply force to the test pad. The probes must be soldered or wired to the tester as part of the manufacturing process each time a new circuit board is tested. Further, the accuracy of the probe tip location relative to the target test pad is dependent on the successful fabrication and installation of all elements of the fixture. Because of the length of the probe relative to the size of the target test pad, any deviation from the vertical translates into a positional error that makes it difficult and expensive to access smaller target test pads. All of the fabrication of the fixture must be done by highly skilled specialist using expensive drilling and routing machines.

This invention increases the accuracy of ICT probes and increases the number of test pads accessible by ICT testers, while concurrently reducing the complexity and cost of ICT fixture fabrication. An additional goal is to transform the fixture fabrication process from a mechanical, hardware driven process requiring highly specialized personnel and expensive facilities, to a three dimensional printing process requiring minimal training and minimal overhead costs. Finally, the invention simplifies the fixture design process and reduces the cost so as to make it accessible to test engineers sooner in the production process.

SUMMARY OF THE INVENTION

The present invention addresses all of the problems of prior technologies. Using a standard, pre-defined tester interface, a fabricated tester interface transfer block can transfer the electrical connection, and in some configurations the spring force of the fixed location probes, to a target pad anywhere on the circuit board. The parts used for the transfer are simple and inexpensive. No soldering or wiring is required. New circuit boards can be supported quickly by printing a new transfer block. The accuracy of the probes is defined by the printer's resolution and do not require specialized training or equipment. The entire transfer block design can be done in software with minimal training of the operator. All of the equipment to design and build a transfer block can be contained on a desktop. No special infrastructure is required.

A tester interface transfer block printed by a three-dimensional printer is fitted on top of a standard, re-usable tester interface comprising a grid of fixed location tester resource contacts. The contacts can be spring-loaded probes or simple circuit board pads. The invention uses the tester interface transfer block to accurately position vertical stacks of a transfer plate and a target probe. These electrical components are mounted internal to the transfer block in tubes and slots positioned and angled to transfer an electrical connection from the tester resource contact through the transfer plate to the transfer plate to the target probe which contacts the target test pads on the circuit board under test.

In one embodiment, separate, moving single piece target probes and transfer plates, or moving target probes with attached transfer plates are utilized. Here, the tester resource contact is a spring-loaded probe, and the target probe is a single piece probe. As the circuit board under test mounted on top is pushed down to start the test, the target probe contacts the target test pad and the force being applied to the circuit board is transmitted to the transfer plate which in turn transmits the force the tester resource probe. This establishes a reliable electrical connection with the target probe through the transfer plate to the tester resource probe.

In another embodiment, the configuration uses fixed transfer plates with spring-loaded probes. Here, the target probes are spring-loaded probes. A compressed spring is used to make reliable electrical contact between the tester resource contact and the transfer plate. As the circuit board under test is pressed down onto the spring-loaded target probes, the spring force makes reliable electrical contact with both the target pad and the transfer plate.

This method of testing is an improvement of previous ICT techniques. Prior techniques would require the testing fixture to be individually, mechanically assembled. Because the fixtures were fixed mechanical items, with the probes mechanically set, a different fixture would need to be crafted for each circuit board. Additionally, minor updates to a circuit board that change the contact test points are costly to re-test. Unique hardware is required for each board.

However, with the new method of testing described herein, all of the replaceable fixture hardware for each different circuit board can be captured in the plastic tester interface transfer block, simplifying the maintenance and board interchange operations and increasing the reliability of the fixture by protecting the electrical elements within the transfer block. Because of the versatility of three dimensional printing, specialized shape target probes can be used in place of the cylindrical target probes. This has the advantage of providing access to test pad types that may not have been accessible using cylindrical probes.

The use of three dimensional printing in the instant invention enables higher accuracy probing of smaller and denser test pads during ICT or bare board testing of printed circuit boards. With three dimensional printing, more complex shapes can be created at a lower cost with less specialized machinery, dramatically simplifying the production process. The high resolution and accuracy of the three dimensional printing allows for increased positional accuracy of the target probes. This invention also minimizes the need for complex wiring or soldering operations during the fixture assembly process.

BRIEF DESCRIPTION OF DRAWINGS

FIG. 1 shows the traditional tester configuration with a custom tester interface and a top pressure rods plate.

FIG. 2 illustrates the testing method using a tester with a fixed grid tester interface, a tester interface transfer block, and a zero flex top plate.

FIG. 3 is a detailed illustration of the moving transfer plates.

FIG. 4 is a detailed illustration of the fixed non-moving transfer plates.

FIG. 5 is an illustration of an additional embodiment of the invention that shows the implementation of specialized shape target probes.

FIG. 6 depicts a means to make contact with the circuit board using vertical side exit pin contacts.

FIG. 7 is the target probe location limit.

FIG. 8 demonstrates the high density target pad spacing example using angled transfer plates.

FIG. 9 is an illustration of the side entrance transfer plate detail.

TERMINOLOGY

There are three fundamental objects used to implement this new testing method: a tester interface transfer block, multiple electrically conductive target probes and multiple electrically conductive transfer plates.

Target Probes: Target probes contact the target test pad of the circuit board that is being tested. Target probes can be simple single pieces, or traditional spring loaded probes, either single or double ended. The single piece target probes can be solid cylinders, rectangular plates, or other specialized shapes. Target probes have a variety of tip types designed for establishing reliable electrical contact with the target test pad. The test pad contact tip diameter may be smaller, equal to or larger than the diameter of the body of the target probe. A major advantage of this design is that single piece target probes can be located in closer proximity to each other than is the case with traditional spring loaded probes, since no body tube is required.

Specialized shaped target probes are designed to make contact with circuit board target test pads that traditional cylindrical probes cannot effectively make contact with. These shapes include rectangular probes for direct trace contact and rectangular probes with sloping sides for side exit pin contact. A specialized shape probe with a sufficiently sharp tip can also be used to contact traditional test pads. This provides additional flexibility in delivering the target probe tip to the test pad in that a rectangular target probe can be used to make corner style adjustments to the location.

Traditional spring loaded target probes can be either single or double ended. An advantage of using traditional probes is that the spring force required to make reliable contact with the test pad is contained in the probe, so the transfer plate does not have to transfer this force. This allows the transfer plate to be fixed and extend to any length without jeopardizing the electrical connection.

Transfer Plates: Transfer plates are electrically conductive objects, either attached to or separate from the target probes, used to transfer the electrical signal of a tester resource probe to a target probe. The transfer plates may be fixed or movable. If movable, the transfer plate is shaped to allow the smooth transmission of pressure from the spring in the tester resource probe to the target probe while simultaneously establishing an electrical connection between the rivo. This shape may be rectangular but is not limited to this. The height of the transfer plate can be modified to adjust the force applied to the test pad. The width and shape of the transfer plate can be modified to extend the distance; the target probe can be located from the tester resource probe.

If traditional spring loaded target probes are used, spring force transfer from the tester resource probe to the target probe is not needed. In this case, the transfer plate may be locked in place and does not have to be shaped for movement. It can be any height and length.

The transfer plate and target probe can also be combined into a single piece. Combining the transfer plates and target probes into a single object provides more reliable electrical contact and easier assembly since only one piece is require to be installed in the transfer block.

Three Dimensional Tester Interface Transfer Block: The tester interface block may be constructed using three dimensional printing technology and is typically formed with plastic material. This block contains the target probe and the transfer plate components. High accuracy guide tubes and transfer slots formed in the transfer block during the three dimensional printing process contain the target probes and the transfer plates. The transfer plate slots are positioned and angled to intersect the center of the tester resource probe tip and the center of the target probe. Tester resource contacts or probes are attached to the tester and not contained within the plastic tester interface transfer block. They have access through an opening in the tester interface transfer block to the base of the transfer plate or directly to the target probe. There will be reliable contact and electrical interconnection from the tester source to the transfer plate as long as the positional inaccuracies of the tester resource probe relative to the transfer block are less than the contact tip radius.

DETAILED DESCRIPTION OF THE INVENTION

At the heart of this invention is the three dimensional tester interface transfer block. The tester interface transfer block is preferably fabricated using three dimensional printing technology. A specially designed software package ("the software") is used to automatically create tubes and slots in the plastic tester interface transfer block. To begin the design process, Computer Aided Design ("CAD") information for the circuit board to be tested is loaded into the software. With this CAD information, the software will determine the relevant circuit board target test pad locations. From there, the appropriate standard tester interface with corresponding tester resource contacts is chosen.

Once the tester resource contacts and target test pad locations are defined, the software determines the location of the closest unused tester resource to each target test pad. During this process, the software will resolve overlapping transfer plates issues using a variety of methods including angled transfer plates and overlapping transfer plates positioned at different heights within the transfer block.

For each target test pad, the software adds a target probe guide tube to accurately position the target probe onto the target test pad. The software then positions a transfer plate guide slot to bridge the gap between these two contact points. Finally, the software positions an access tube over the tester resource contact. Once these elements are designed, an industry standard three dimensional print language, such as STL, is generated and used to transfer the design to the printer.

After printing the transfer block, the transfer plate and target probe must be inserted into their respective slots. When designing a single, non-stacking block, a choice can be made whether to install the transfer plate and the target probe from the top or the bottom. Top installation of the transfer plate means that the guide slot opens on the top surface of the block and intersects the target probe guide tube. This limits the thickness of the transfer plate to substantially less than the width of the target probe.

If the transfer plate is installed from the bottom, the transfer plate guide slot does not open on the top surface, so a larger thickness transfer plate can be used without interfering with the integrity of the target probe tube guide. This configuration has the advantage of greater mechanical strength and a larger contact surface area, thereby reducing electrical resistance. With this configuration, a means is needed to prevent the transfer plate from dropping out after installation. The preferred method of ensuring the transfer plate is secure is by use of a retainer plate that is installed after the transfer plates and target probes are installed. This plate has tester resource access holes of sufficient diameter to allow passage of the tester resource probe with margins for alignment inaccuracies.

When the target probe contact tip diameter is greater than the diameter of the target probe cylinder, the probe must be installed from the top. To retain the probes in the transfer block, the guide tube is sized to provide enough friction to retain the probe but not enough to prevent movement under spring force.

FIG. 2 is a diagram of one embodiment of the apparatus for testing a circuit board 2 using moving transfer plates 7 and tester resource probes 23. The tester interface is the mechanism that houses the tester resource probes 23 and provides the means to connect them with the testing fixture. This fixture allows the design and use of a standard, reusable tester resource interface with a number of pre-positioned tester resource probes 23. For this apparatus, the combination of target probe accuracy, location, and spring force are most accurately defined by three dimensional printing. The final mapping of the tester resource probes 23 to the target test pads on the circuit board 2 is done by using the tester interface transfer block 1. The standard tester resource interface is reusable and is adaptable to different circuit boards using the lower cost, higher accuracy tester interface transfer block 1.

In this configuration, the electrical tester 21 is on the bottom of the apparatus with an attached fixed grid reusable tester interface 30, housing the tester resource probes 23. The tester interface transfer block 1 fits over the tester interface 30, with tester resource probes 23 passing through the resource probes access tubes 24 in the transfer block 1. During testing, the circuit board 2 to be tested is placed on top of the tester interface transfer block 1 and the zero flex block 31 is placed on top of the board. Pressure is applied to the top zero flex block 31 to force the circuit board 2 downward to contact the target probes 4. The pressure on the target probes 4 is transferred by the transfer plates 7 to the tester resource probes 23. The springs in the tester resource probes apply an equal and opposite force to the transfer plates 7 and target probes 4, thereby establishing a reliable electrical interconnection from the tester resource probe 23 to the target test pad 3.

The apparatus can be used on circuit hoards that do not have any components soldered or otherwise attached to them, as well as on circuit hoards that do have attached components 25. Using a three-dimensional printer, component clearance voids 28 can automatically be printed in the plastic block to provide clearance for the parts 25 on the circuit board 2. All other areas on the circuit board 2 will contact the top surface of the transfer block 1.

In another embodiment, an additional zero flex block 31 can be printed using a three dimensional printer and fitted to the top of the circuit board 2. All top areas of the circuit board 2 will contact the top zero flex block 31. The combination of the bottom transfer block 1 and top zero flex block 31 prevents bending of the circuit board 2 during the test as the circuit board 2 is pressed against the target probes 4.

FIG. 3 illustrates the use of the bottom-mounted moving tester interface transfer plates 7. Views of the top, side, and bottom of the tester interface transfer block 1 are shown. Two embodiments are depicted. In one embodiment, a single component comprises both the target probe and transfer plate components. In a second embodiment, the target probe and transfer plate are separate components.

The transfer plates reside in the guide slots 8 of the plastic tester interface transfer block 1. As shown in the bottom view, the guide slots 8 are positioned and angled such that they pass through the center of both the target probe 4 and the fixed location of the tester resource contacts. Two embodiments of tester resource contacts are depicted. Tester resource probe 23 contains internal spring 39 and attaches to the tester through the body of the probe. Conductive spring 10 passes through the tester resource access tube 24 and contacts the transfer plate 7 on the top and the conductive tester interface pad 11 on the bottom. The guide slots 8 extend from the bottom of the tester interface transfer block 1 up to a predetermined stop point. The separate transfer plate 7 is sized to move smoothly in the guide slot 8 when off-center force is applied. The attached transfer plate 36 on target probe with attached transfer plate 18, can be much smaller than the transfer plate 7 because the smooth movement of the target probe 18 with attached transfer plate 36 is assured by the high accuracy probe guide tube 5. Detail A shows another embodiment of a target probe with attached transfer plate in which the transfer plate 36 is attached to a probe socket 19. Target probe 20 with a socket mating tip 40 is press fit into the probe socket 19. This allows more flexibility in pairing a wide variety of test pad contact tip types 41 with a predefined group of probe sockets 19 with attached transfer plates.

The transfer plate guide slot 8 is printed in the tester interface transfer block 1 and positioned to maximize the contact surface of the plate with both probes, as well as to compensate for any positional inaccuracies. It is preferred that the guide slot 8 be slightly wider than the thickness of the transfer plate 7 to minimize friction. Sufficient dimensional allowance is provided in the transfer plate guide slot 8 and the tester resource access tube 24 to compensate for any positional inaccuracies of the transfer block relative to the tester resource probe 23 or conductive spring 10.

During testing, when the circuit board 2 is pushed down against the target probes 4 or 18, the target probes 4 or 18 contact the test pads 3 on the circuit board 2 and the downward force is applied to the transfer plates, 36 or 7. The target probes 4 or 18 and transfer plates 36 or 7 move downward in the guide slot 8 and the transfer plates 36 or 7 apply pressure to the tester resource probes 23 or conductive springs 10. The equal and opposite force provided by the tester resource internal probe spring 39 or conductive spring 10 ensures a reliable electrical interconnection from the tester resource contacts through the transfer plates 36 or 7 and target probes 4 or 18 to the test pads 3.

During assembly of the tester interface transfer block 1, the transfer plates 18 and 7 will be inserted from the bottom. While top or bottom installation of the transfer plate is possible, the bottom installation shown in FIG. 3 has the advantage of allowing thicker transfer plates 18 to be used without interfering with the target probe guide tube 5, thereby maximizing the electrical contact surface and potentially improving mechanical stability. Top installation would require that the transfer plate 18 thickness be less than the target probe 4 diameter. After the bottom-mounted transfer plates have been installed, a retainer block 35 is installed to securely lock the transfer plates into the transfer block 1.

FIG. 4 illustrates another embodiment in which the transfer block 1 contains fixed, non-moving transfer plates 16 and conductive springs 10. A tester interface circuit board 12 is attached to the bottom of transfer block 1. A separate probe block 6 is printed to contain the target probes 14 or 15. When standard spring loaded target probes are incorporated into the design, a moving transfer plate is not needed to transfer the spring force from the tester resource probe to the target probe. The transfer block 1 is assembled by first installing the conductive spring 10 and then the transfer plate 16. The transfer plate 16 and conductive spring 10 can be combined into a single piece for ease of assembly and additional mechanical reliability. When target probe block 6 is placed over the transfer block 1, extended retention pins 13 that are printed onto the probe block 6 press down on the transfer plate 16. This pressure compresses the conductive spring 10, establishing reliable electrical contact with the conductive tester interface pad 11 on the tester interface circuit board 12. This configuration has the advantage of allowing any length transfer plate without regard for smooth plate movement.

FIG. 4 also teaches two types of spring loaded probes—single ended probes 14 and double headed probes 15. Single ended probe 14 contacts the top of the transfer plate 16. When the circuit board under test 2 is pressed own onto the spring loaded tip, the spring pressure is transferred through the probe body to make reliable contact with the transfer plate 16 because the target probe guide tube 5 is sized slightly larger than the target probe 14 in order to allow free movement. The double ended probe 15 is press-fit and locked into place by friction. The base end tip of the double ended target probe 15 is compressed to make reliable electrical contact with the transfer plate 16.

FIG. 5 illustrates the use of specialized probe shapes and testing locations. Due to the versatility of three dimensional printing, specialized shape target probes 37 could be used in place of the traditional cylindrical target probes 4. Many pads on circuit boards can be rectangular in shape. The use of rectangular tipped specialized shape target probes 37 provides a better contact surface than traditional circular probe tips.

A further source of specialized contact is the traces on the circuit board. Traces are the pathways on a circuit board that make electrical connections between the pins on the electrical components. Traces are typically longer than they are wide. If a connecting trace 27 is sufficiently long, a rectangular tipped specialized shape target probe 37 can be positioned to contact the trace as if it were a regular pad. In practice, this requires that an opening be provided in any protective covering on the circuit board for the probe 37 to be able to make electrical contact.

In addition, side exit pins are pins on an electrical part that exit the body of the part to the side. These side pins can be an important source of additional test pads. One example of this form of testing that the apparatus is capable of is depicted in FIG. 6, where the rectangular specialized shape target probe 37 on the left probe of FIG. 5 is designed to access the side exiting pins 26 of electrical part 25.

FIG. 6 provides more details about the side pin connections. Some side pins are essentially vertical as the exit the electrical component body. By using a specialized shape, like that seen in FIG. 5, contact can be made. As the rectangular target probe 37 is forced upward by the spring force of the tester resource probe 23, the triangular tip portion contacts the sloped portion of the guide tube 5. This forces the target probe 37 to move to the right until target probe 37 contacts the vertical pin 26.

In addition to numerous options that this testing apparatus provides for target test pad shapes, the use of a three dimensional printer to create the tester interface transfer block 1 allows the tester probes 23 to be more tightly packaged to reach smaller components. The width of the transfer plate determines the distance that the target probe can be separated from the tester resource access.

FIG. 7 shows a top view of four pre-positioned tester resource probes 23. If the minimum spacing of the tester resource probes are less than or equal to the standard width of the transfer plates 7, then by rotating and shifting the location of the transfer plate guide slots and the target probe guide tubes using three dimensional printing, the target probes 4 can be located anywhere within the boundaries of the tester resource probes field as shown by the dashed outline of FIG. 7. Any test pad at any location within the rounded rectangle outline can be reached with at least one of the tester resource probes 23. This allows building a tester interface using three dimensional printing, which provides higher accuracy test fixtures at a low cost. The target test pad on a circuit board can be located in close proximity. Traditional tester resource probes must be spaced sufficiently far apart to allow for the electrical connection method and the additional size of the socket body. For traditional probes, many target pads spaced too close together may have to be skipped.

FIG. 7 demonstrates that the testing apparatus allows access to tightly spaced target pads down to the required wall thickness between three dimensional printed target probe guide tubes. FIG. 8 further demonstrates this feature by showing four target probes 4 spaced closely together. The space between the probes 4 is the wall separating the target probe guide tubes 5. The required thickness of this wall is much less than the minimum space requirements of traditional probes. In some cases, depending on the geometry of the tester resource probes 23 and the target probes 4, angled transfer plates 17 may be used to access tightly spaced target pads.

FIG. 9 demonstrates the use of side entrance transfer plates. Transfer plates can enter from the side of the transfer block and extend horizontally through the block for as long a distance as necessary. This is useful when multiple test pads need the same resource from the tester. In particular, it is frequently necessary to provide multiple power and ground connections to the circuit board during electrical testing in order to provide sufficient current to power the board. The side entry transfer plate 38 is supported by multiple conductive springs 10 which flex to provide the necessary force for the target probes 4 to connect to the target test pads 3. Moving transfer plates 7 extend from the side entrance plate 38 to connect the target probes 4 to the side entrance transfer plate 38.

I claim:

1. A method to transfer electrical contact from tester resource contacts to target probes, comprising:
   (a) providing a tester resource interface transfer block, comprising one or more fixed transfer plates and one or more conductive springs;
   (b) providing a probe block, comprising at least one spring-loaded target probe and one or more extended retention pins;
   (c) attaching a tester interface circuit board comprising the tester resource contacts to the tester interface transfer block;
   (d) placing the probe block over the tester resource interface transfer block, causing the extended retention pins to press down on the fixed transfer plate; and
   (e) compressing the one or more conductive springs, causing electrical contact between the tester resource contacts and target probes.

2. The method of claim 1, wherein said transfer plates and said springs comprise a single combined object.

3. A tester interface transfer block for electrical circuit board testing by transferring electrical contact from one or more tester resource contacts to one or more target probes, comprising:
   (a) two or more guide tubes each comprising at least one target probe;
   (b) two or more access tubes each comprising at least one tester resource contact;
   (c) at least one transfer plate guide slot;
   (d) at least one transfer plate; and
   (e) at least one conductive spring, wherein said conductive spring is located in the access tube between the transfer plate and the tester resource contact to establish an electrical connection between said transfer plate and said tester resource contact;

wherein said transfer plate guide slot is positioned and angled to intersect between an end of the tester resource contact and an end of the target probe such that a reliable electrical connection can be established between the tester resource contact and the target probe;

wherein the positioning of said guide slot enables flexible positioning of the target probe relative to the tester resource contact; and wherein said transfer plates are fixed and non-moving.

4. The tester interface transfer block of claim 3 wherein said tester interface transfer block is constructed using three-dimensional printing.

5. The method of claim 1, wherein the tester interface transfer block and the probe block constructed using a three-dimensional printer.

6. The tester interface transfer block of claim 3, further comprising multiple tester resource contacts fabricated in a fixed grid pattern;
   wherein said tester resource contacts comprise conductive pads on a tester interface circuit board;
   wherein a target probe block is fabricated separate to the transfer block;
   wherein a target probe block comprises the target probes and one or more extended retention pins;
   wherein said transfer block being adapted to integration with a reusable tester resource fixture; and
   wherein said springs may be compressed by the one or more extended retention pins to establish an electrical connection between the tester resource contact and the transfer plate.

* * * * *